United States Patent [19]

Ogura

[11] Patent Number: 4,926,210
[45] Date of Patent: May 15, 1990

[54] IMAGE FORMING APPARATUS

[75] Inventor: Mitsuru Ogura, Nara, Japan

[73] Assignee: Sharp Kabushiki Kaisha, Osaka, Japan

[21] Appl. No.: 222,881

[22] Filed: Jul. 22, 1988

[30] Foreign Application Priority Data

Jul. 23, 1987 [JP] Japan .................................. 62-184350
Jul. 23, 1987 [JP] Japan .................................. 62-184351

[51] Int. Cl.⁵ .............................................. G03B 27/32
[52] U.S. Cl. ...................................................... 355/28
[58] Field of Search ............................. 355/27, 28, 29; 430/138

[56] References Cited

U.S. PATENT DOCUMENTS 4,624,560  11/1986  Beery ..................................... 355/27
4,783,683  11/1988  Nagumo et al. ....................... 355/27

Primary Examiner—L. T. Hix
Assistant Examiner—Khanh Dang
Attorney, Agent, or Firm—Birch, Stewart, Kolasch & Birch

[57] ABSTRACT

An apparatus for forming an image comprising a unit for forming a selectively cured image on a light-receiving sheet coated with a layer of microcapsules containing colorless dye and photopolymerization agent by exposing the sheet to light, an image forming unit for forming a colored image on an image-receiving sheet coated with a layer of a developing material by laying the image-receiving sheet on top of the light-receiving sheet and compressing these sheets, the light-receiving sheet being provided in a roll sheet form and the image-receiving sheet being provided in either a cut-sheet form or roll sheet form, and a cutter disposed on the downstream side of the compression portion for cutting the light-receiving sheet and image-receiving sheet.

6 Claims, 2 Drawing Sheets

IMAGE FORMING APPARATUS

BACKGROUND OF THE INVENTION

The present invention relates to an apparatus for forming an image using a light-receiving sheet coated with a layer of microcapsules containing colorless dye and photopolymerization agent (such as photopolymerization monomer) and an image-recieving sheet coated with a layer of a developing material and subjecting the light-receiving sheet to an exposure process and subjecting both sheets to a compression process so that a colored image is formed on the image-receiving sheet.

A method for image formation comprising the steps of directing light on a light-receiving sheet coated with a layer of microcapsules containing colorless dye and a photopolymerization agent thereby to form a selectively cured image on the light-receiving sheet, and laying an image-receiving sheet coated with a layer of developing material on top of the aforesaid light-receiving sheet and pressing these sheets against each other thereby to form a colored image on the image-receiving sheet is disclosed in U.S. Pat. No. 4,399,209. When the light-receiving sheet is exposed to a light image of an original, the microcapsules at the portion subjected to the light are cured, and as a result, a selectively cured image is formed on the light-receiving sheet as a whole. Thereupon, if the image-receiving sheet coated with a layer of developing material is laid on top of the light-receiving sheet and these sheets are pressed against each other, the uncured microcapsules are ruptured and the colorless dye contained therein flows out. Then, the colorless dye forms a color image by reaction between the same and the developing material of the image-receiving sheet. Thus, by providing a supply portion of the light-receiving sheet and a supply poriton of the image-receiving sheet in the main body of an image forming apparatus, different from a copying machine using the conventional electorphotographic process, and by arranging such that both the sheets are delivered from their supply portions and the exposure process and the compression process are performed, a duplication of the image of an original can be obtained on the image-receiving sheet.

However, there has existed the problem that a reversal image formed of cured microcapsules remains on the light-receiving sheet after use as a result of the rupture of the microcapsules corresponding to the positive image occurring while the sheet is compressed in the pressure portion and, the content of the reproduction might therafter be or made available to another person if the light-receiving sheet is not discharged, but left within the main body of the image forming apparatus. In connection with this, a technique to have a light-receiving sheet, after use, taken up in roll form is disclosed in U.S. Pat. No. 4,624,560.

In the above described image forming method, a considerably high pressure must be used for compressing the two sheets lying on upon the other. Therefore, when the apparatus is structured such that either the light-receiving sheet or the image-receiving sheet must be supplied from a sheet supply cassette, there arises a problem that the upper and lower pressure rollers for compressing the two sheets vertically move every time the sheets are inserted in between the pressure rollers to be passed therethrough, and at the same time, the torque for rotating the rollers largely varies. There is also a problem that meandering is caused in the transported direction of the sheets or wrinkles are formed in the sheets depending on the condition of the front edge of the sheet when inserted in between the pressure rollers.

SUMMARY OF THE INVENTION

An object of the present invention is to provide an apparatus for image formation in which the light-receiving sheet is cut away by a cutter and discharged together with the image-receiving sheet into discharge sheet trays so that the problem of leaking to a third party of the content of the information copied may be avoided.

Another object of the present invention is to provide an apparatus for image formation in which the light-receiving sheet and image-receiving sheet are both arranged in a roll sheet form such that both sheets are cut at the downstream side of the compression portion, and the sheets are discharged into discharge sheet trays, so that all the problems mentioned above may be overcome.

The present invention relates to an apparatus for image formation which forms a selectively cured image on a light-receiving sheet coated with a layer of microcapsules filled with colorless dye and a photopolymerization agent by exposing the sheet selectively to light, and then, by laying an image-receiving sheet coated with a layer of a developing material on top of the light-receiving sheet and compressing these sheets, thereby forms a colored image on the image-receiving sheet. The apparatus is characterized in that the light-receiving sheet is arranged in a roll sheet form and the image-receiving sheet is arranged in a cut-sheet form, a cutter for cutting the light-receiving sheet is provided at the downstream side of the compression portion, and transport paths are provided for transporting the light-receiving sheet cut away by the cutter and the image-receiving sheet with a colored image formed thereon into discharge sheet trays.

In an alternate embodiment of the present invention, an apparatus as aforesaid is characterized in that both the light-receiving sheet and the image-receiving sheet are arranged in a roll sheet form, and a cutter for cutting both the sheets together is provided at the downstream side of the compression portion of the apparatus, and transport paths are provided for transporting both the light-receiving sheet and the image-receiving sheets, cut away by the cutter, into discharge sheet trays.

According to the present invention, the light-receiving sheet is convenient since it is arranged in a roll sheet form. Further, after the light receiving sheet and the image-receiving sheet sandwhiched one upon the other have been compressed, the light-receiving sheet is adapted to be cut by a cutter and transported together with the image-receiving sheet into dischage sheet trays. Hence, the operator can take away the light-receiving sheet together with the image-receiving sheet with the colored image formed thereon, or the duplicate, from the apparatus. Hence, no light-receiving sheet with a negative image of the original formed thereon is left behind in the main body of the image forming apparatus.

According to the present invention, both the light-receiving sheet and the image-receiving sheet can be arranged in a roll sheet form and there is provided a cutter for cutting both the sheets at the downstream side of the compression portion, and therefore, there are always present the two sheets at the pressure station between the pressure rollers. Both of the sheets passing the pressure station are cut together by the cutter and discharged into discharge sheet trays.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF THE PREFERRED EMBODIMENTS

Figure 1:
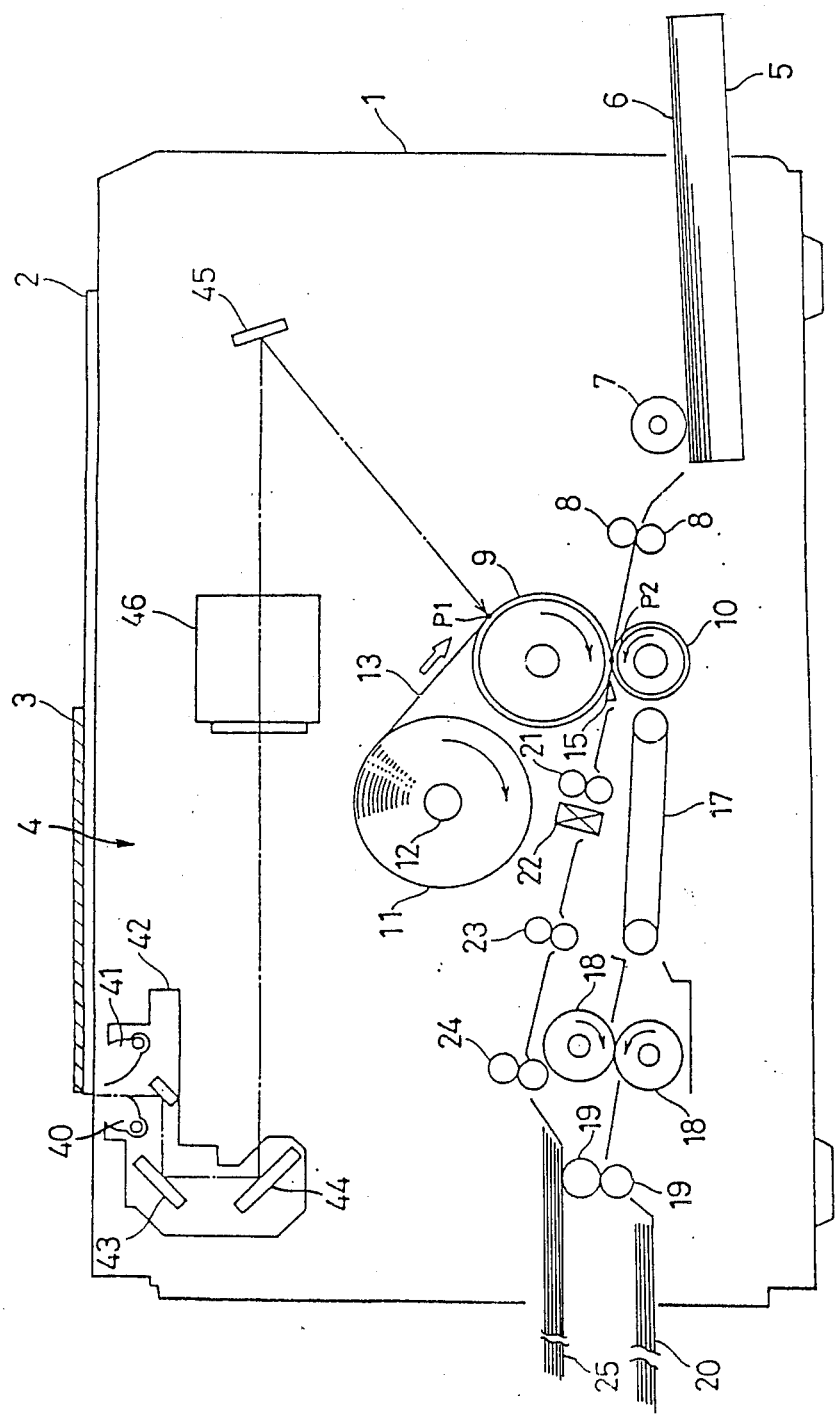
FIG. 1 is a constructional drawing of an apparatus for image formation according to a first embodiment of the present invention.

FIG. 1 is a constructional drawing of an apparatus for image formation according to a first embodiment of the present invention. Referring to the figure, a main body 1 of an image forming apparatus provided with an original platen 2 disposed on the top of the same. An original 3 placed on the original platen 2 is scanned by an optical portion 4. The optical portion 4 is made up of two illuminating lamps 40, 41, reflecting mirrors 42, to 45, and a lens 46. The structure of the optical portion is the same as the optical portion of any conventional copying machine.

At the bottom right-hand corner of the main body 1 of the image forming apparatus, there is provided a sheet supply cassette 5 containing image-receiving sheets 6 in a cut-sheet form. A sheet of the image-receiving sheets 6 is supplied from the sheet supply cassette 5 by means of a sheet supply roller 7 and sent to a compression portion by means of rollers 8.

Virtually in the center of the main body 1 of the image forming apparatus and closer to the bottom, there is provided a main drum 9 serving as an upper roller of pressure rollers, and below the main drum 9 and confronting the same there is provided a compression roller 10 serving as a lower pressure roller. Above and at the left of the main drum 9, there is provided a light-receiving sheet roll portion 11 for rotation around a rotational shaft 12. A light-receiving sheet 13 supplied from the light-receiving sheet roll portion 11 is wound around the main drum 9. A point P1 above and at the right of the main drum 9 indicates an exposure point. The exposure point P1 is illuminated by light reflected from the reflecting mirror 45. The point of contact between the main drum 9 and the compression roller 10 becomes the pressure point P2, and at this position, the light-receiving sheet 13 and image-receiving sheet 6 lying one upon the other are brought together between the upper and lower rollers, the main drum 9 and the compression roller 10.

At the left of the pressure point P2, there is provided a separating blade 15 for separating the light-receiving receiving sheet 13 and the image-receiving sheet 6 in cut-sheet form passing the pressure point P2, whereby the image-receiving sheet 6 is turned downward.

Slightly above and at the left of the separating blade 15, there are provided rollers 21, and at the left of the same, there is provided a cutter 22. At the downstream side of the cutter 22, there are provided rollers 23 and rollers 24.

The image-receiving sheet 6, separated by the separating blade 15, is transported leftward held on transport belt 17. Heat rollers 18 are provided for giving a gloss to the colored image formed on the image-receiving sheet. The image-receiving sheet is coated with a developing material, and this developing material is coated with a thermoplastic resin. As the image-receiving sheet is passed through the heat rollers 18, the thermoplastic resin is melted by the heat. At that time, the surface of the colored image is made even and a glossy image is thereby obtained. Art relative to such processing is disclosed in Japanese Laid-open Patent Publication No. 60-259490. At the left of the heat rollers 18, there are provided sheet discharging rollers 19 and a discharge sheet tray 20 for the image-receiving sheet. The image-receiving sheet with an image made glossy by the heat of the heat rollers 18 is discharged into the discharge sheet tray 20.

On the other hand, the light-receiving sheet 13 passing the pressure point P2 is cut by a cutter 22 when it has traveled the distance corresponding to the length of the image-receiving sheet 6 from the rollers 21. The cut out, light-receiving sheet is transported downstream by means of the rollers 23 and 24 and discharged into a discharge sheet tray 25 for the light-receiving sheet.

With the above described arrangement, the light-receiving sheet 13, supplied from the light-receiving sheet roll portion 11, is first exposed to light at the exposure point P1 and supplied to the pressure point P2. At the exposure point P1, the portion of the light-receiving sheet 13 corresponding to the white portion in the original 3 is exposed to light and the photopolymerization monomer in the microcapsules located at the exposed position causes a photopolymerization reaction therein whereby the microcapsules are cured. That is, a selectively cured image is formed by the microcapsules cured by the photopolymerization and the other microcapsules which are not cured. The light-receiving sheet 13 with the selectively cured image formed thereon and the image-receiving sheet 6 are pressed together at the pressure point P2. Thereby, the microcapsules not cured by photopolymerization are ruptured and the colorless dye contained therein flows out. The colorless dye flowing out of the microcapsules reacts with the developing material over the image-receiving sheet 6 and forms a color image. Thus, an image of the original 3 is formed on the image-receiving sheet 6 as it passes through the pressure point P2. The light-receiving sheet 13 after use is cut into the length of the image-receiving sheet by the cutter 22 as described above and discharged through the rollers 23 and 24 into the discharge sheet tray 25. Meanwhile, the image-receiving sheet 6 with the colored image formed thereon is separated by the separating blade 15 and transported by the transport belt 17 to the heat rollers 18. The image-receiving sheet 6 with the surface of the colored image thereon made glossy by the heat rollers 18 is discharged into the discharge sheet tray 20.

Figure 2:
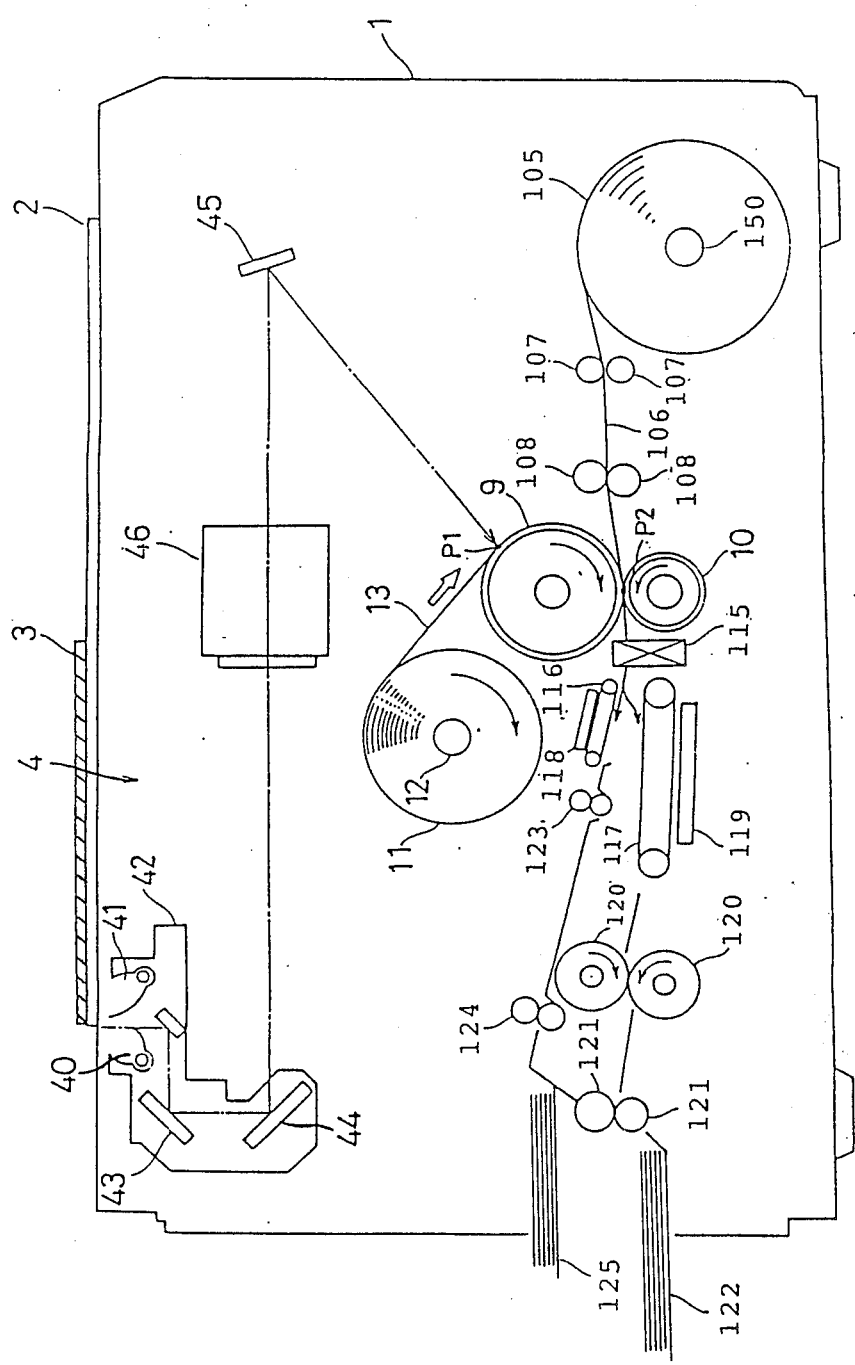
FIG. 2 is a constructional drawing of an apparatus for image formation according to a second embodiment of the present invention.

FIG. 2 is a constructional drawing of an image forming apparatus according to a second embodiment of the present invention. In FIG. 2, like reference numerals to those in FIG. 1 denote like or corresponding parts and description thereof will be omitted here.

parts and description thereof will be omitted here.

At the bottom right-hand corner of the main body of the image forming apparatus 1, there is provided an image-receiving sheet roll portion 105 for rotation around a rotational axis 150 and an image-receiving sheet 106 is delivered from the roll portion through rollers 107 and 108 to the compression portion.

At the pressure point P2, the light-receiving sheet 13 and the image-receiving sheet 106 lying one upon the other are pressed between the upper and lower rollers, the main drum 9 and the compression roller 10.

At the left of the pressure point P2, there is provided a cutter 115, whereby the light-receiving sheet 13 and the image-receiving sheet 106 passing the pressure point P2 are cut when these sheets have traveled the distance corresponding to the length of the original. At the left of the cutter 115, there are provided two transport belts 116 and 117, the one upon the other, and these transport belts 116 and 117 are provided with air suction devices 118 and 119. At the left of the lower transport belt 117, there are provided heat rollers 120, and at the left thereof, there are provided sheet discharging rollers 121 and a discharge sheet tray 122. On the other hand, at the left of the upper transport belt 116, there are provided transport rollers 123, and at the downstream side thereof, or at the position above and at the left of the heat rollers 120, there are provided sheet discharging rollers 124, and at the downstream side thereof, there is provided a discharge sheet tray 125 into which the light-receiving sheet is discharged.

With such an arrangement, the light-receiving sheet 13 and the image-receiving sheet 106 passing the pressure point P2 are moved past the cutter 115 located at the downstream side of the pressure point P2. When the sheets have traveled the distance corresponding to the length of the original 3, i.e., when the image region has passed the cutter 115, the cutter 115 operates so that the light-receiving sheet 13 and the image-receiving sheet 106 are cut together. Both the sheets thus cut away are transported downstream as they are, but both the sheets are soon separated upward and downward by the air suction devices 118, 119. That is, the light-receiving sheet 13 is sucked up and the image-receiving sheet 106 is sucked down. The two sheets are transported downstream by the transport belts 116, 117 as they are sucked up and down, and the light-receiving sheet is discharged through the transport path including the transport rollers 123 and sheet discharging rollers 124 into the discharge sheet tray 125. On the other hand, the image-receiving sheet 106 is transported by the transport belt 117 to the heat roller 120. The heat rollers 120 are, the same as the heat rollers 18 in the above described first embodiment, for giving a gloss to the colored image formed on the light-receiving sheet. The image-receiving sheet 106 passed through the heat rollers 120 is discharged through the sheet discharging rollers 121 into the discharge sheet tray 122.

According to the apparatus for forming an image of the present invention, since the light-receiving sheet is provided in a roll sheet form, such effects are obtained that the need for sheet supply rollers or the like which were used when the light-receiving sheet was provided in a cut-sheet form can be eliminated and the microcapsules which are relatively vulnerable to external force can be protected from such force while transported. Further, when the light-receiving sheet has traveled a distance after passing the compression portion, its used portion is cut off by a cutter and discharged together with the image-receiving sheet into discharge sheet trays, and therefore, the operator can take away the light-receiving sheet after use with a negative image formed thereon together with the reproduction sheet (image-receiving sheet). Hence, when the content of duplication is confidential, it can be protected from being leaked to another person.

According to the apparatus for forming an image of the present invention, since both the light-receiving sheet and the image-receiving sheet are provided in a roll sheet form and used portions of both the sheets are cut away after passing the compression point, there are always present the two sheets at the compression point between the pressure rollers. Hence, the pressure rollers make no vertical movement. Since the rollers rotate always with the two sheets put in between, no large variation is produced in the torque. Further, since none of the edges of the light-receiving sheet and image-receiving sheet is inserted in between the rollers in the course of the operation, meandering motion of the sheets rarely occurs and wrinkles are scarcely made in the sheets.

While only certain embodiments of the present invention have been described, it will be apparent to those skilled in the art that various changes and modifications may be made therein without departing from the spirit and scope of the present invention as claimed.

What is claimed is:

1. An image forming apparatus comprising:
   means for providing a light-receiving sheet in roll sheet form to an exposure station and an image forming station, said light-receiving sheet being coated with a layer of microcapsules containing a colorless dye and a photopolymerization agent;
   means for selectively exposing said light-receiving sheet to a light image;
   means for providing an image forming sheet to said image forming station in cut sheet form, said image forming sheet being coated with a layer of a developing material for reacting with said colorless dye on said light-receiving sheet to produce a color image, said light-receiving sheet and image forming sheet being formed into a sandwich configuration at said image forming station;
   means for compressing said light-receiving sheet and said image-receiving sheet to form a colored image on said image-receiving sheet at said image forming station;
   means for separating said light-receiving sheet from said image forming sheet;
   a cutter means disposed subsequent to said compressing means and sheet separating means for cutting said light-receiving roll sheet to convert said exposed portion of said roll sheet to a single sheet corresponding to said image portion;
   a first discharge tray provided on one side of said apparatus for discharge thereto of said cut light-receiving sheet; and
   a second discharge tray provided on the same side of said apparatus as said first discharge tray for discharge thereto of said image-receiving sheet.

2. The apparatus of claim 1, further including a transport unit for transporting both said light-receiving sheet cut by said cutter and said image-receiving sheet with a colored image formed thereon into said discharge trays.

3. An image forming aspparatus comprising in combination:
   means for providing a light-receiving sheet in roll sheet form to an exposure station and an image forming station, said light-receiving sheet being coated with a layer of microcapsules containing a colorless dye and photopolymerization agent;

means for selectively exposing said light-receiving sheet to a light image;

means for providing an image forming sheet in roll sheet form to said image forming station, said image forming sheet being coated with a layer of a developing material for reacting with said colorless dye of said light-receiving sheet to produce a color image, said light-receiving sheet and said image forming sheet being formed into a sandwich configuration at said image forming station;

means for compressing said light-receiving sheet and said image receiving sheet to form a colored image on said image receiving sheet at said image forming station;

a cutter means disposed subsequent to said compressing means for cutting said light-receiving roll sheet corresponding to said exposed portion of said roll sheet and said image receiving roll sheet simultaneously to form single sheets of both said light-receiving sheet and said image receiving sheet corresponding to said exposed portion of said light-receiving sheet and said developed image on said image receiving sheet.

4. The apparatus of claim 3, further including means for separating both of said cut light receiving sheet and image receiving sheet subsequent to said means for cutting both of said light-receiving roll sheet and image receiving roll sheet.

5. The apparatus of claim 3, further including a first discharge tray disposed on one side of said apparatus for discharging said light-receiving sheet thereto and a second discharge tray disposed on the same side of the apparatus as the first discharge tray for discharging said image receiving sheet thereto.

6. The apparatus of claim 5, further including a transport unit for transporting both said light-receiving sheet and said image-receiving sheet cut by said cutter into a respective said discharge tray.

* * * * *